(12) United States Patent
Igel et al.

(10) Patent No.: US 6,204,549 B1
(45) Date of Patent: *Mar. 20, 2001

(54) OVERVOLTAGE PROTECTION DEVICE

(75) Inventors: Guenter Igel, Teningen; Joachim Krumrey, Freiburg i.Br., both of (DE)

(73) Assignee: Micronas Intermetall GmbH, Freiburg (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,441

(22) Filed: Aug. 21, 1998

(30) Foreign Application Priority Data

Aug. 23, 1997 (DE) ............................. 197 36 754

(51) Int. Cl.[7] ................... H01L 29/00; H01L 23/58; H01L 23/62; H01L 29/74; H01L 31/11
(52) U.S. Cl. .................. 257/529; 257/355; 257/546; 257/665; 257/173
(58) Field of Search ............... 257/10, 11, 355, 257/546, 173, 529, 522

(56) References Cited

U.S. PATENT DOCUMENTS

| | | | |
|---|---|---|---|
| 4,198,744 | * | 4/1980 | Nicolay ................... 29/623 |
| 5,786,613 | * | 7/1998 | Kalnitsky ................ 257/355 |
| 5,903,041 | * | 5/1999 | La Fleur et al. ......... 257/530 |
| 5,908,318 | * | 6/1999 | Wang et al. ............. 438/619 |
| 5,909,033 | * | 6/1999 | Koga et al. .............. 257/10 |

FOREIGN PATENT DOCUMENTS

| | | |
|---|---|---|
| 4421256 | 1/1995 | (DE) . |
| 0525763 | 2/1993 | (EP) . |

OTHER PUBLICATIONS

"Transient Voltage Suppression Devices", Harris Semiconductor, Harris Corporation, Chapter 2, pp. 2–1 thru 2–12, 1990.
Bock, et al., "New Field–Emitter Switch for ESD Protection of Microwave Circuits", Electronics Letters, vol. 28, No. 19, pp. 1822–1824, Sep. 10, 1992.
S. Iannazzo, "A Survey of the Present Status of Vacuum Microelectronics", Solid State Electronics, vol. 36, No. 3, pp. 301–320, 1993.
Copy of German Search Report for 197 36 751.2, dated May 20, 1998.

* cited by examiner

*Primary Examiner*—Mahshid Saadat
*Assistant Examiner*—Jesse A. Fenty
(74) *Attorney, Agent, or Firm*—Arthur L. Plevy; Buchanan Ingersoll PC

(57) ABSTRACT

The invention relates to an overvoltage protection device and to a method for fabricating such a device. A substrate (1) is provided with a first electrode layer (2), above which extends a second electrode layer (3) which is separated from the first electrode layer (2) by a distance (d) determined by the thickness of a spacing layer (4). The spacing layer (4) has an opening (5) which forms a cavity (6) between the electrode layers (2, 3).

15 Claims, 1 Drawing Sheet

OVERVOLTAGE PROTECTION DEVICE

FIELD OF INVENTION

This invention relates to an overvoltage protection device.

BACKGROUND OF INVENTION

Overvoltage protection devices are available in two basic varieties, namely semiconductor devices, particularly Zener diodes and varistors, and gas discharge devices. Such overvoltage protection devices are known from "Transient Voltage Suppression Devices", Harris Semiconductor, Harris Corporation, 1990, particularly Chapter II. Different properties of different semiconductor devices and a gas discharge device are described. The semiconductor devices have is the disadvantage of a high leakage current, which results in a permanent power loss. A low breakdown voltage is difficult to implement and leads to a high leakage current. The semiconductor devices also have a relatively high depletion-layer capacitance, which results in a relatively long response time. Gas discharge devices have more favorable leakage current characteristics and, thus, a lower power loss. However, they cannot be used as low-voltage protection devices, since they can only provide overvoltage protection well above 100 V. Furthermore, gas discharge devices have a wide tolerance with respect to their rated voltage. Semiconductor devices have the disadvantage of requiring a large amount of chip area. Gas discharge devices are not suitable for integration.

The object of the invention is to provide an overvoltage protection device and a process of fabricating an overvoltage protection device which has a low leakage current and, thus, a low power loss, a short response time, and a low breakdown voltage, so that it is suitable for use as a low-voltage protection device.

SUMMARY OF INVENTION

An overvoltage protection device including a substrate (1) with a first electrode layer (2) deposited thereon, over which extends a second electrode layer (3) which is separated from the first electrode layer (2) by a distance d determined by the thickness of a spacing layer (4), the spacing layer (4) having an opening (5) which forms a cavity (6) between the electrode layers (2, 3).

And, a method for fabricating the same, the method including the steps of depositing on a substrate a first electrode layer (2), a spacing layer (4), and a second electrode layer (3) one on top of the other, the spacing layer (4) being provided with at least one opening (5) which forms a cavity (6) between the electrode layers (2, 3).

DETAILED DESCRIPTION OF INVENTION

Figure 1:
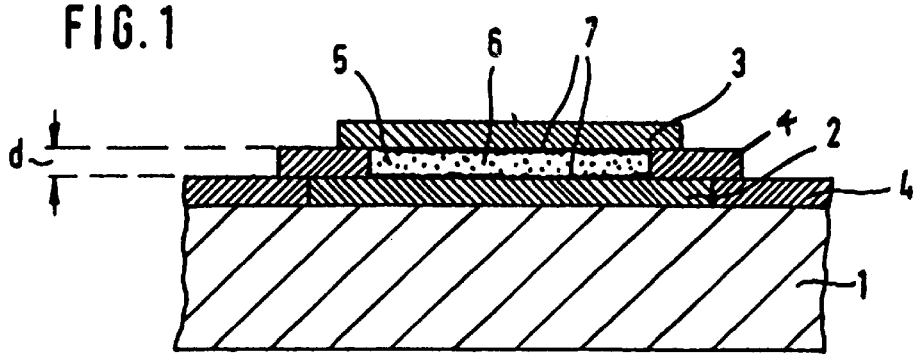
FIG. 1 shows one embodiment of an overvoltage protection device according to the invention.

This object is attained by an overvoltage protection device comprising a substrate with a first electrode layer deposited thereon, over which extends a second electrode layer which is separated from the first electrode layer by a distance d determined by the thickness of a spacing layer, the spacing layer having an opening which forms a cavity between the electrode layers.

The overvoltage protection device according to the invention is thus implemented on a substrate, so that it is suitable for integration. It operates in a fashion similar to a gas discharge device. As a result of the technology employed, it can be designed to be suitable for use as a low-voltage protection device. As the overvoltage protection device can be fabricated in the substrate using microcircuit fabrication technology, its geometry can become very small and be precisely defined. Thus, an overvoltage protection device can be fabricated which is suitable for providing low-voltage protection and has a small rated-voltage tolerance. Its leakage current is small, and it has a low capacitance, and thus a short response time.

Furthermore, the object is attained by a process for fabricating an overvoltage protection device comprising depositing on a substrate a first electrode layer, a spacing layer, and a second electrode layer one on top of the other, the spacing layer being provided with at least one opening which forms a cavity between the electrode layers. The overvoltage protection device can thus be fabricated with the above advantages in a simple manner by conventional microcircuit fabrication processes.

Preferred embodiments of the invention are disclosed in the subclaims.

In one preferred embodiment of the invention, the electrode layer is made of an electron-emitting material having a very low work function. The first electrode layer is then used as an emitter electrode, and the second electrode layer forms the back potential which extracts the electrons after the discharge in the cavity. The second electrode layer may be made of an electron-emitting material having a very low work function. If the first electrode layer is also made of an electron-emitting material having a very low work function, the overvoltage protection device is polarity-invariant.

The cavity may advantageously be filled with a gas. The type of gas can be chosen freely or to be suitable for particular properties; for example, noble gases or other gases with favorable gas discharge properties can be used. With the specifically selected gases, more selective characteristics of the overvoltage protection element can be set than would be possible with air. The type and quantity of the gas as well as the geometry of the structure can be chosen to define a predetermined voltage $U_0$ suitable for overvoltage protection. An essential quantity in this connection is the distance d between the electrode layers.

Advantageously, at least one of the electrode layers has a distinctive topography. This topography may be constituted by a certain surface roughness which increases the available emission of primary electrons from that electrode layer. Through the surface roughness, the field strength can be locally increased. This property can be augmented by forming peaks on the surface.

In another preferred embodiment of the invention, the substrate comprises a semiconductor body. In that case, the overvoltage protection device can be fabricated in a simple manner by conventional semiconductor production processes. It can be produced in the semiconductor body itself, so that it is automatically incorporated in the semiconductor structure. This also permits a space-saving structure, which is particularly advantageous in the semiconductor field because of the high cost of materials. The substrate may be coated with an insulating layer. This is particularly advantageous if the substrate is not made of an insulating material and better isolation is desired.

In a further preferred embodiment of the invention, the insulating layer corresponds to the passivating layer of an IC chip. In this embodiment, the IC chip is first produced by the usual process steps, which are then followed by the steps necessary for the overvoltage protection device. These are compatible with the process steps necessary for the fabrication of the IC chip. Good isolation from the semiconductor body is achieved without the need to deposit an additional insulating layer. The electrodes and the spacing layer may also be formed within the passivating layer. This eliminates the need for additional masking steps, as the layers necessary for the overvoltage protection device are formed in the normal fabrication process of the IC chip.

In a further embodiment of the invention, the spacing layer is formed from a material having a substantially greater etch rate than the material of the electrode layers, and the second electrode layer is provided with windows through which the spacing layer is etched down to the first electrode layer in such a way that portions of the spacing layer are left behind at the side of the opening. Because of the etch-rate difference, the electrode layers are thus essentially preserved, and the spacing layer can be etched to form a cavity between the electrode layers. The remaining portions of the spacing layer serve as supports and determines the distance between the electrode layers.

In still another embodiment of the invention, the opening in the spacing layer is formed prior to the deposition of the second electrode layer, and the latter is formed by depositing a sheetlike material. The sheetlike material may be provided with a window which permits the cavity to be filled with gas. The gas may also be introduced into the cavity through lateral openings. The sheetlike material may be nonpermanently or permanently joined to the spacing layer. A nonpermanent joint may be made, for example, by clamping, whereby reliable and durable contact is made. A permanent joint may be made by soldering, adhesive bonding, and the like. The overvoltage protection device may also be provided with two or more cavities, of course. The sheetlike material used for the second electrode layer may be a perforated sheet. The perforated sheet must then be mounted on the spacing layer in such a way that the holes register with the openings in the spacing layer. If a sheetlike material is used for the second electrode layer, it can also be used as a cover for the overvoltage protection device or the IC chip.

The gas is advantageously introduced into the cavity while the structure is being mounted. In that case, the overvoltage protection device is sealed from the environment anyhow, so that the gas can neither escape nor be contaminated. If the mounting is done by soldering, a gas can be used which is also suitable for the soldering process. This takes advantage of the fact that many gases suitable for gas discharge also aid the soldering.

The invention will now be described in greater detail with reference to the accompanying drawings.

The embodiment of an overvoltage protection device shown in FIG. 1 includes a substrate 1. The substrate 1 may be made, for example, of an insulating material, such as glass, or a semiconductor material, such as silicon. The substrate 1 supports a first electrode layer 2, above which extends a second electrode layer 3. Between the first electrode layer 2 and the second electrode layer 3, a spacing layer 4 is provided, whose thickness determines a distance d between the first electrode layer 2 and the second electrode layer 3. The spacing layer 4 has an opening 5 which forms a cavity 6 between the electrode layers 2, 3.

The first electrode layer 2 or the second electrode layer 3 or both electrode layers 2, 3 may be made of an electron-emitting material having a very low work function. The cavity 5 may be filled with air or a gas. The type and quantity of the gas as well as the geometry of the structure are chosen to define a predetermined voltage $U_0$ suitable for overvoltage protection. In the embodiment shown, the surfaces 7 of the first electrode layer 2 and the second electrode layer 3 have a specific topography. This increases the available electron emission from the respective electrode layer 2, 3. In addition, an emission capability varying locally along the surface can thus be achieved.

This structure forms an overvoltage protection device which works on the principle of a gas discharge device and can be integrated on a substrate using microelectronic circuit fabrication technology.

Figure 2:
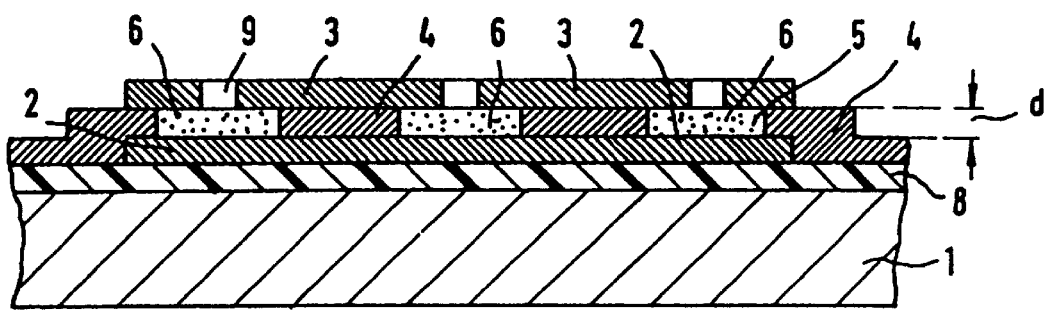
FIG. 2 shows another embodiment of the overvoltage protection device according to the invention.

FIG. 2 shows another embodiment of the overvoltage protection device. The substrate 1 is covered by an insulating layer 8. If, in the embodiment shown, the substrate 1 is a semiconductor body, the insulating layer 8 isolates the semiconductor body from the first electrode layer 2. The spacing layer 4 provided between the first electrode layer 2 and the second electrode layer 3 has three openings 5, which each form a cavity 6. Each of the cavities 6 is filled with a suitably chosen gas, which is a contributory factor in determining the voltage $U_0$ suitable for overvoltage protection. The remaining portions of the spacing layer 4 define the distance d between the first and second electrode layers 2, 3. In this embodiment, a large is total cavity 6 is formed, as the individual cavities add together. The remaining portions of the spacing layer 4 have a supporting function for the second electrode layer 3. It is thus possible to introduce a greater total quantity of gas into the total cavity 6, so that a higher sensitivity of the overvoltage protection device can be achieved. The second electrode layer 3 has windows 9 through which the gas can enter the cavities 6.

Figure 3:
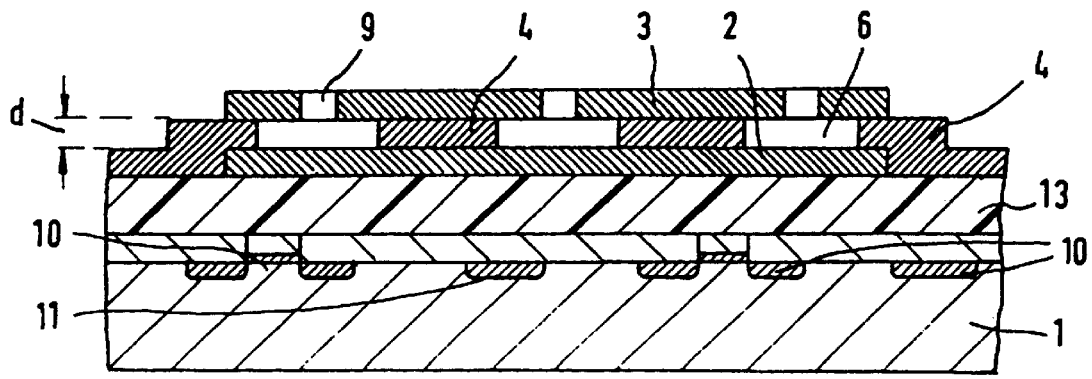
FIG. 3 shows a further embodiment of the overvoltage protection device according to the invention.

FIG. 3 shows an overvoltage protection device whose operation and structure correspond essentially to those of the overvoltage protection device of FIG. 2. Like reference characters have been used to designate like elements which have similar functions, so that in the following, only the differences from the overvoltage protection device of FIG. 2 will be described. The substrate 1 is a semiconductor substrate containing active regions 10. As indicated in the figure, these may form MOS transistors, resistors, and the like. An IC chip is thus formed. Its surface is provided with a passivating layer 13. The passivating layer 13 is an insulating layer whose function corresponds to that of the insulating layer 8 of FIG. 2. On this passivating layer 13, the first electrode layer 2, the second electrode layer 3, and the spacing layer 4 are formed as in the structure of FIG. 2.

Further developments of the overvoltage protection device according to the invention are possible. For instance, the structure consisting of first electrode layer 2, second electrode layer 3, and spacing layer 4 may be formed within the passivating layer of an IC chip. The first and second electrode layers can then be formed simultaneously with the metal interconnections, and the spacing layer 4 can be formed together with other insulating layers. The number of cavities 6 may be arbitrary. For each cavity 6, two or more windows may be provided in the second electrode layer 3.

A first embodiment of the process according to the invention will now be described with reference to FIG. 2. The substrate 1 is covered with the insulating layer 8. On the insulating layer 8, the first electrode layer 2 is formed, which is covered with the spacing layer 4. The spacing layer 4 is covered with the second electrode layer 3, in which windows 9 are formed. The different layer on the substrate 1 are formed by conventional microelectronic circuit fabrication processes. One example is semiconductor process technology, with the substrate 1 being a semiconductor substrate. The spacing layer 4 is formed from a material having a substantially greater etch rate than the material of the electrode layers 2, 3. The spacing layer 4 is etched through the window 9 from the surface of the second electrode layer 3. The different etch rates of the materials of the spacing layer 4 and the electrode layers 2, 3 cause an undercutting effect: The material of the first electrode layer 2 and that of the second electrode layer 3 are essentially preserved, while the material of the spacing layer 4 is etched laterally. The etching process continues until cavities 6 have been formed which are bounded on the sides by portions of the spacing layer 4. The overvoltage protection device is then mounted onto a lead frame or a printed circuit board and provided with a cover. During the mounting process, the cavities 6 are filled with a gas.

In a second embodiment of the process according to the invention, the insulating layer 8, the first electrode layer 2 and the spacing layer 4 are deposited in a manner analogous to that in the process just described. Next, the openings 5 are formed in the spacing layer 4. This is done by techniques commonly used in microelectronic circuit fabrication technology, particularly by conventional masking and etching techniques. After that, a sheetlike material is placed as the second electrode layer 3 on the spacing layer 4 and joined to the latter, either permanently, for example by bonding, or nonpermanently, for example by clamping. In the embodiment shown, the sheetlike material has windows 9 which register with the openings 5 of the spacing layer 4.

What is claimed is:

1. An overvoltage protection device comprising a substrate, a first electrode layer deposited thereon, over which extends a second electrode layer separated from the first electrode layer in its entirety, wherein at least one portion of said first electrode layer and at least one portion of said second electrode layer are separated by at least a distance d associated with a thickness of a spacing layer, the spacing layer including an opening which forms a cavity between the electrode layers.

2. The overvoltage protection device of claim 1, wherein the first electrode layer is made of an electron-emitting material having a very low electron work function.

3. The overvoltage protection device of claim 1, wherein the second electrode layer is made of an electron-emitting material having a very low electron work function.

4. The overvoltage protection device of claim 1, wherein the cavity is filled with a gas.

5. The overvoltage protection device of claim 1, wherein the type and quantity of the gas as well as the geometry of the structure are chosen to define a predetermined voltage $U_0$ suitable for overvoltage protection.

6. The overvoltage protection device of claim 1, wherein at least one of the electrode layers has a specific topography.

7. The overvoltage protection device of claim 1, wherein the substrate comprises a semiconductor body.

8. The overvoltage protection device of claim 1, wherein an insulating layer is deposited on the substrate.

9. The overvoltage protection device of claim 1, wherein the insulating layer corresponds to a passivating layer of an IC chip.

10. The overvoltage protection device of claim 1, wherein the electrode layers and the spacing layer are formed within a passivating layer of an IC chip.

11. An overvoltage protection device comprising:
   a substrate;
   a first electrode layer formed above said substrate;
   a spacing layer formed above said first electrode layer;
   a second electrode layer formed above said spacing layer; and,
   a cavity formed in said spacing layer between said first and second electrode layers;
   wherein, said spacing layer separates said first electrode layer from said second electrode layer in their entireties.

12. The device of claim 11, wherein said cavity is filled with a cavity gas.

13. The device of claim 12, wherein the quantity and properties of said cavity gas and geometry of said device define a predetermined voltage suitable for overvoltage protection.

14. An overvoltage protection device comprising:
   a substrate;
   a first electrode layer deposited over said substrate;
   a spacing layer deposited at least partially over said first electrode layer and including at least one aperture therein;
   a second electrode layer deposited over at least a portion of said spacing layer;
   wherein, said entire first and second electrode layers are separated from one another, and said aperture at least partially defines a gap between said first and second electrode layers.

15. An overvoltage protection device comprising:
   a substrate;
   a first electrode layer deposited over said substrate;
   a spacing layer deposited at least partially over said first electrode layer;
   a second electrode layer deposited over at least a portion of said spacing layer such that it is separated from the first electrode layer by at least distance d associated with a thickness of the portion of the spacing layer,
   wherein, the spacing layer includes at least one aperture therein which in combination with said first and second electrode layers defines a cavity.

* * * * *